US006516382B2

United States Patent
Manning

(10) Patent No.: US 6,516,382 B2
(45) Date of Patent: *Feb. 4, 2003

(54) MEMORY DEVICE BALANCED SWITCHING CIRCUIT AND METHOD OF CONTROLLING AN ARRAY OF TRANSFER GATES FOR FAST SWITCHING TIMES

(75) Inventor: Troy A. Manning, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/891,567

(22) Filed: Jun. 25, 2001

(65) Prior Publication Data

US 2001/0037429 A1 Nov. 1, 2001

Related U.S. Application Data

(62) Division of application No. 09/578,917, filed on May 25, 2000, which is a division of application No. 09/002,237, filed on Dec. 31, 1997, now Pat. No. 6,105,106.

(51) Int. Cl.[7] ..................... G06F 13/00; G11C 11/4063; H03K 17/04
(52) U.S. Cl. ....................... 711/105; 711/167; 365/233; 326/113; 326/17; 327/374; 327/404
(58) Field of Search ................................ 711/105, 167; 365/233, 189.12, 189.08; 327/374, 401, 404; 326/113, 17

(56) References Cited

U.S. PATENT DOCUMENTS

| 4,622,648 | A |   | 11/1986 | Whitaker ................. 326/113 |
|-----------|---|---|---------|-----------------------------------|
| 4,912,348 | A |   | 3/1990  | Maki et al. .............. 326/113 |
| 4,985,647 | A |   | 1/1991  | Kawada ................... 326/113 |
| 5,159,616 | A |   | 10/1992 | Douglas et al. ............ 377/79 |
| 5,239,206 | A |   | 8/1993  | Yanai ..................... 327/202 |
| 5,414,745 | A |   | 5/1995  | Lowe ...................... 377/114 |
| 5,534,815 | A |   | 7/1996  | Badyal .................... 327/437 |
| 5,646,898 | A |   | 7/1997  | Manning .................. 365/205 |
| 5,808,483 | A |   | 9/1998  | Sako ...................... 326/113 |
| 5,831,453 | A |   | 11/1998 | Stamoulis et al. .......... 326/113 |
| 5,844,424 | A |   | 12/1998 | Krishnamurthy et al. ..... 326/49 |
| 6,105,106 | A | * | 8/2000  | Manning .................. 711/105 |

* cited by examiner

Primary Examiner—Glenn Gossage
(74) Attorney, Agent, or Firm—Dorsey & Whitney LLP

(57) ABSTRACT

A memory device including a balanced switching circuit and methods for controlling an array of transfer gates. The balanced switching circuit comprises a plurality of transfer gates. The plurality of transfer gates are arranged in N rows and N columns with the N transfer gates in each row connected in series between a first signal terminal and a second signal terminal. Each one of N clock terminals is coupled to a respective control terminal of only one transfer gate in each row and only one transfer gate in each column. The transfer gates are selectively clocked or activated in response to clock signals to couple the first signal terminal to the second signal terminal such that the switching speed is independent of the order in which the individual series connected pass transistors or transfer gates are activated.

28 Claims, 6 Drawing Sheets

… …

MEMORY DEVICE BALANCED SWITCHING CIRCUIT AND METHOD OF CONTROLLING AN ARRAY OF TRANSFER GATES FOR FAST SWITCHING TIMES

CROSS-REFERENCE TO RELATED APPLICATIONS

This application is a divisional of U.S. patent application Ser. No. 09/578,917, filed May 25, 2000, which is a divisional of U.S. patent application Ser. No. 09/002,237, filed Dec. 31, 1997, issued as U.S. Pat. No. 6,105,106.

TECHNICAL FIELD

The present invention relates generally to the transfer of signals in logic circuits and, more specifically, to a balanced transfer gate circuit having a switching speed that is independent of the order in which individual series connected transfer gates are activated.

BACKGROUND OF THE INVENTION

In the design of logic circuits, particularly in the area of semiconductor memories, pass or transfer gates are utilized in a variety of applications to selectively transfer signals from one portion of a circuit to another. A typical transfer gate includes a p-channel metal oxide semiconductor (PMOS) transistor and an NMOS transistor having their drains coupled together to form an input, their sources coupled together to form an output, and the gates of the respective transistors receiving complementary control clock signals. The transfer gate couples its input to its output in response to the control clock signals, and thus operates as an electronic switch to transfer a signal placed on its input to its output. By utilizing both PMOS and NMOS transistors, the voltage level of signals that can be transferred by the transfer gate is not limited by the threshold voltages of the transistors.

The switching time of a transfer gate is the time it takes to transfer a signal from the input to the output. The switching time is a function of a number of factors including the gate-to-source and drain-to-source junction capacitances, and the channel resistance of the MOS transistors. In addition, the switching time is a function of the load presented by circuitry coupled to the output of the transfer gate. When a number of transfer gates are connected in series, the output of an individual transfer gate may be loaded by other transfer gates in the series connected circuit. The load presented by such other transfer gates varies as the other transfer gates are selectively activated and deactivated.

In addition, the load presented on the output of an individual transfer gate is a function of the order in which the other transfer gates are activated. For example, if four transfer gates are connected in series, the load presented on the output of the second transfer gate depends on whether transfer gates three and four are activated or deactivated, and the order in which they are activated.

FIG. 1 is a schematic of a conventional switching circuit 10 including two series-connected transfer gates 12 and 14. The transfer gate 12 receives a pair of complementary clock signals CLK0 and $\overline{CLK0}$, and couples its input IN to its output when the signals CLK0 and $\overline{CLK0}$ are high and low, respectively. The transfer gate 14 receives a pair of complementary clock signals CLK1 and $\overline{CLK1}$, and couples its input to its output OUT when the signals CLK1 and $\overline{CLK1}$ are high and low, respectively. When both the clock signals CLK0 and CLK1 are high, the transfer gates 12 and 14 are activated, coupling the input IN to the output OUT. If either of the signals CLK0 and CLK1 is low, one of the transfer gates 12 or 14 is turned OFF isolating the input IN from the output OUT.

During operation of the switching circuit 10, external circuitry (not shown in FIG. 1) develops the clock signals CLK0 and CLK1 to control activation of the transfer gates 12 and 14. The :external circuitry may at times activate the transfer gate 12 before the transfer gate 14, and at other times the reverse will be true. The switching speed of the switching circuit 10 is the time it takes for a signal on the input IN to be coupled to the output OUT. Ideally, the switching speed is independent of the order in which the transfer gates 12 and 14 are activated. In the circuit 10, however, the switching speed depends upon which transfer gate 12 or 14 is activated first. This is true because when the transfer gate 14 is activated first, the transfer gate 12 drives the load on the output OUT through the activated transfer gate 14, and when the transfer gates 12 and 14 are activated in the reverse order, the transfer gate 14 directly drives the load on the output OUT. For example, assume both transfer gates 12 and 14 are initially deactivated so the input IN is isolated from the output OUT. Further assume the signal on the input IN is high. When the transfer gate 12 is activated, the high input signal is coupled to the output of the transfer gate 12. When the transfer gate 14 is thereafter activated it must drive the load presented on the output OUT in order to drive the output OUT high. In contrast, when the transfer gate 14 is activated first, the transfer gate 12 can drive the load presented on the output OUT through the channel resistance or impedance of the transfer gate 14. Thus, when the load on the output OUT is capacitive, for example, the additional impedance of the transfer gate 14 and corresponding increased RC time constant result in the output OUT going high more slowly.

There is a need for a switching circuit including a number of series-connected transfer gates in which the switching speed of the switching circuit is independent of the sequence in which the transfer gates are activated.

SUMMARY OF THE INVENTION

A balanced switching circuit comprises a plurality of switch circuits, each switch circuit having an input terminal, an output terminal, and at least one control terminal adapted to receive a control signal. Each switch circuit is operable to couple the input terminal to the output terminal in response to the control signal. The plurality of switch circuits are arranged in N rows and N columns with the input and output terminals of the N switch circuits in each row connected in series between a first signal terminal and a second signal terminal. Each switch circuit in a given column has its control terminal connected to one of N clock terminals adapted to receive respective clock signals. Further, each clock terminal is coupled to the control terminal of only one switch circuit in each row and one switch circuit in each column. The balanced switching circuit is operable to couple the first signal terminal to the second signal terminal in response to the clock signals.

DETAILED DESCRIPTION OF THE INVENTION

Figure 1:
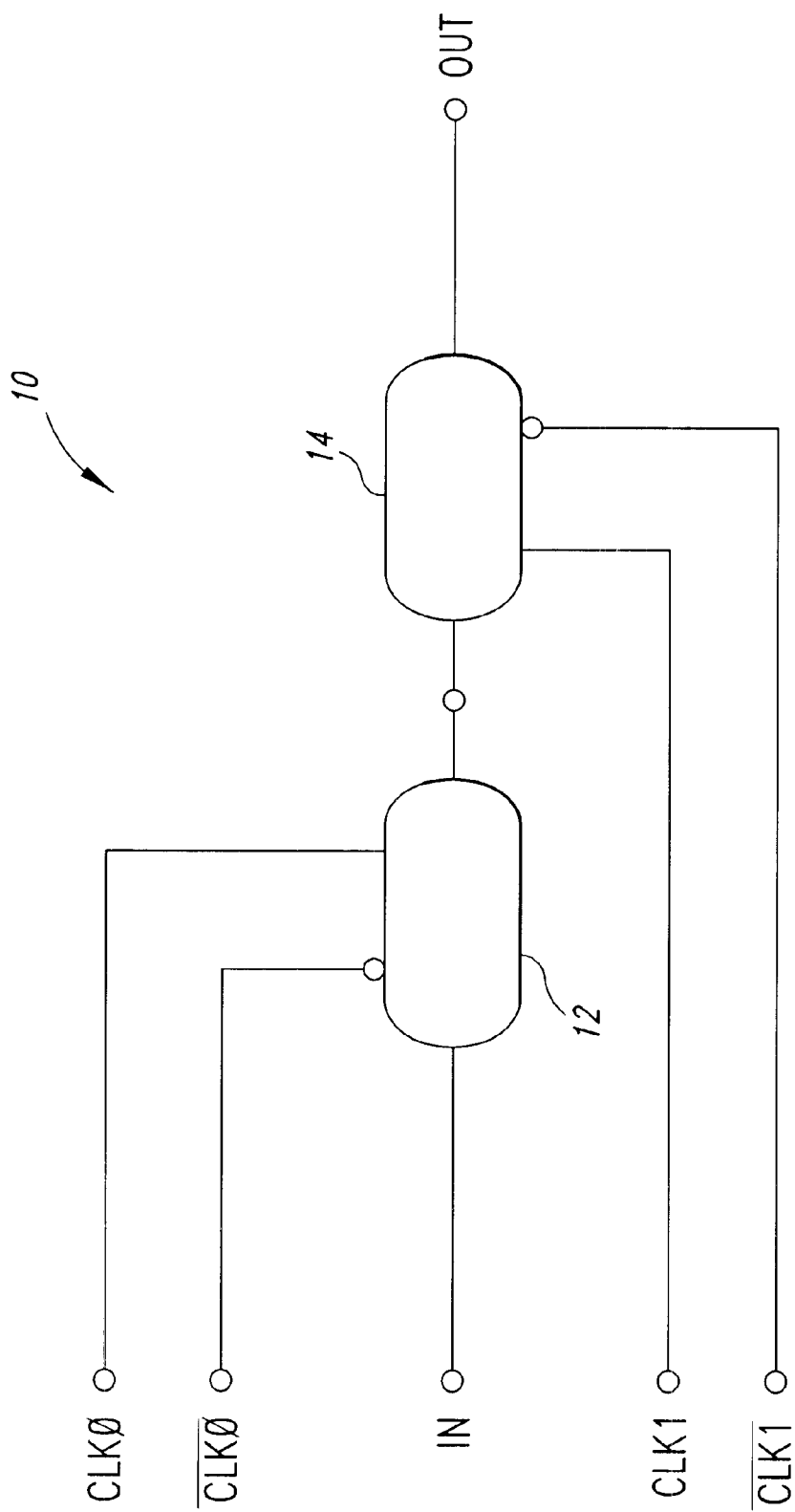
FIG. 1 is a schematic diagram of a conventional switching circuit including two series-connected transfer gates.
Figure 2:
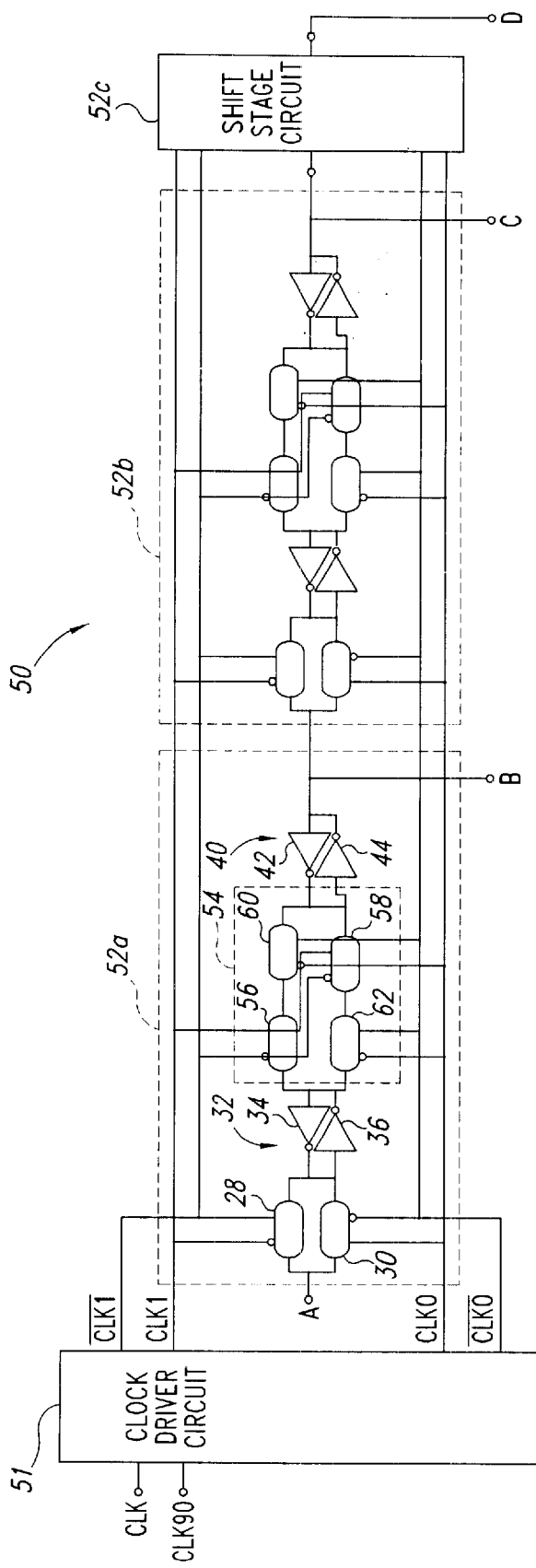
FIG. 2 is a schematic diagram of a shift register circuit including a balanced switching circuit according to one embodiment of the present invention.

FIG. 2 is a schematic diagram of a shift register circuit 50 according to one embodiment of the present invention. The shift register circuit 50 includes a clock driver circuit 51 receiving a pair of clock signals CLK and its quadrature CLK90, and developing a pair of complementary clock signals CLK0, $\overline{CLK0}$ and CLK1, $\overline{CLK1}$ in response to the signals CLK and CLK90. The clock driver circuit 51 drives the clock signal CLK0 high only when both the signals CLK and CLK90 are high, and drives the clock signal CLK1 low only when both the signals CLK and CLK90 are low. Only the signals CLK1 and CLK0 will be discussed in describing the operation of the shift register circuit 50, one skilled in the art understanding the signals $\overline{CLK0}$ and $\overline{CLK1}$ are merely the respective complements of these signals. The shift register circuit 50 further includes three shift stage circuits 52a–c connected in series, each of which receives the clock signals CLK0 and CLK1. The shift stage circuits 52a–c operate in combination to sequentially shift an input signal A from one stage circuit to the next stage circuit in response to the clock signals CLK0 and CLK1, as will be described in more detail below.

The shift stage circuit 52a includes a pair of transfer gates 28 and 30 connected in parallel. The input terminals of the transfer gates 28 and 30 receive the input signal A, and the control terminals of the transfer gates 28 and 30 receive the clock signals CLK1 and CLK0, respectively. When the clock signal CLK1 is low, the input signal A is coupled through the transfer gate 28 to an input of a latch circuit 32 formed by a pair of cross-coupled inverters 34 and 36. The latch circuit 32 latches its input at the logic level of the input signal A, and its output at the complementary logic level. The input signal A is coupled to the input of the latch circuit 32 through the transfer gate 30 when the clock signal CLK0 is high. If the clock signals CLK0 and CLK1 are low and high, respectively, the transfer gates 28 and 30 are both deactivated, isolating the input signal A from the latch circuit 32. The output of the latch circuit 32 is coupled through a balanced transfer gate or balanced switching circuit 54 to an input of a second latch circuit 40 formed by a second pair of cross-coupled inverters 42 and 44. The latch circuit 40 operates identically to the latch circuit 32 to latch its input at the logic level of a signal applied on the input, and its output B at the complementary logic level. The output B of the latch circuit 40 is a first output of the shift stage circuit 52a, and is coupled to the input of the shift stage circuit 52b.

The balanced transfer gate circuit 54 includes two series-connected pairs of transfer gates 56, 60 and 58, 62 connected in parallel between the output of the latch circuit 32 and the input of the latch circuit 40. The control terminals of the transfer gates 56 and 58 receive the complementary clock signals CLK1 and $\overline{CLK1}$, and the control terminals of the transfer gates 60 and 62 receive the complementary clock signals CLK0 and $\overline{CLK0}$. In this configuration, the transfer gates 56 and 58 are either both activated, or both deactivated in response to the clock signal CLK1, and the transfer gates 60 and 62 are likewise either both activated, or both deactivated in response to the clock signal CLK0.

The shift stage circuits 52b and 52c are identical to shift stage circuit 52a and thus, for the sake of brevity, will not be described in further detail. The outputs of the shift stage circuits 52b and 52c are designated C and D, respectively, and provide second and third outputs of the shift register circuit 50.

Figure 3:
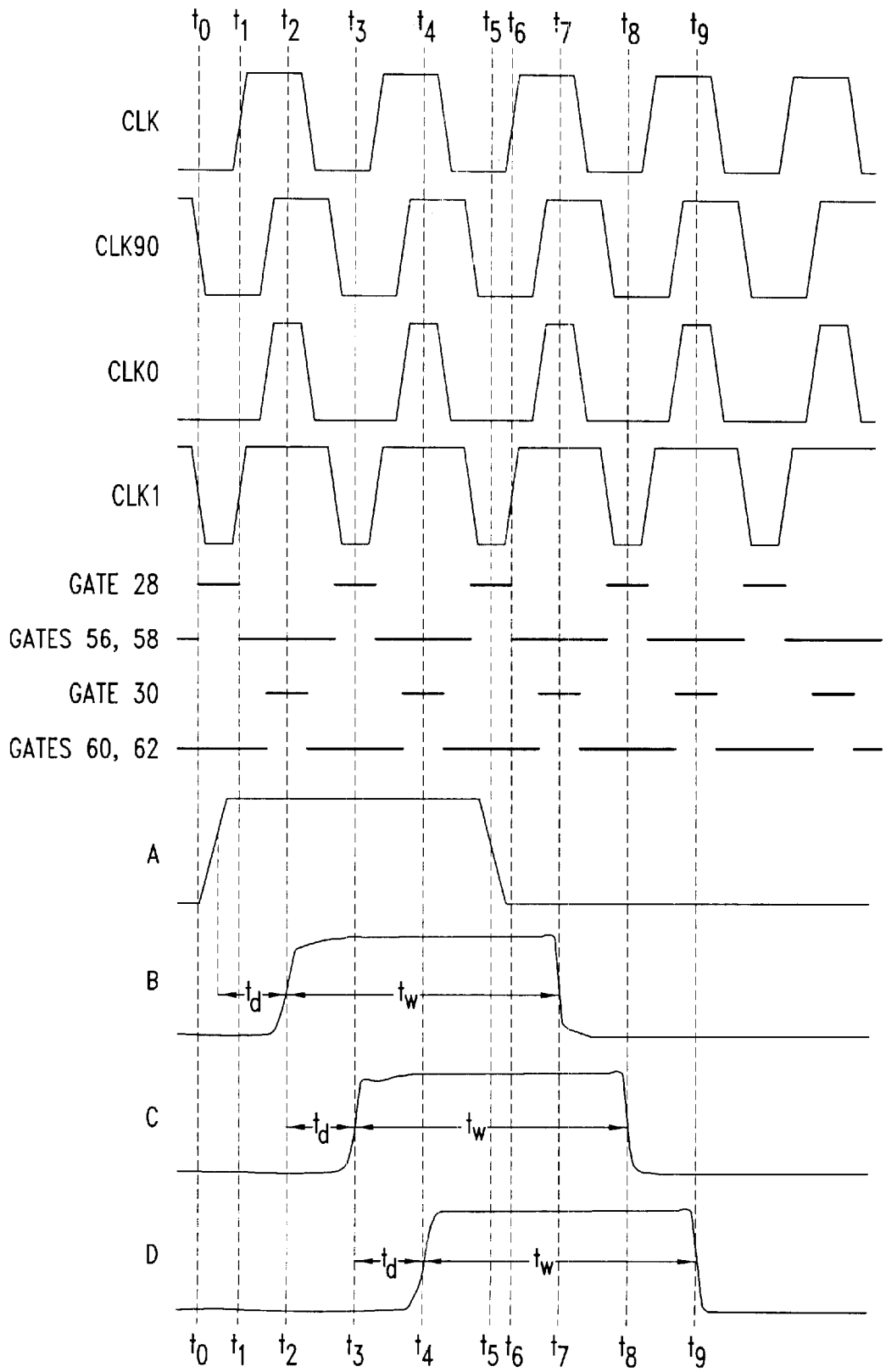
FIG. 3 is a dining diagram of various signals during operation of the shift register circuit of FIG. 2.

The operation of the shift register circuit 50 will now be described with reference to the timing diagram of FIG. 3. At just before a time $t_0$, the signals CLK0, CLK, A, B, C, and D are all low, and signals CLK1 and CLK90 are high. The states of the transfer gates 28, 30, and 56–62 are represented in FIG. 3 with solid lines indicating a respective transfer gate is activated, and no solid line indicating the transfer gate is deactivated. At just before $t_0$, the transfer gates 56–62 are activated, and transfer gates 28 and 30 are deactivated.

At time $t_0$, the clock driver circuit 51 drives the clock signal CLK1 low in response to the clock signal CLK90 going low. When the clock signal CLK1 goes low, the transfer gate 28 is activated, and transfer gates 56 and 58 are deactivated. At just after the time $t_0$, the input signal A goes high. The high input signal A is coupled through the activated transfer gate 28 to the input of the latch circuit 32 which latches its input high and output low. At this point, notice that the balanced transfer gate circuit 54 isolates the output of the latch circuit 32 from the input of latch circuit 40 because the transfer gates 56 and 58 are deactivated.

At a time $t_1$, the clock driver circuit 51 drives the clock signal CLK1 high in response to the clock signal CLK going high. When the clock signal CLK1 goes high, the transfer gate 28 is deactivated and transfer gates 56 and 58 are activated. When the transfer gates 56 and 58 are activated, the low output of the latch circuit 32 is coupled to the input of the latch circuit 40 through the balanced transfer gate circuit 54 since transfer gates 56–62 are now all activated. The latch circuit 40 latches its input low and its output B high at a time $t_2$ in response to the low output from the latch circuit 32. The output B does not go high until a delay time $t_d$ after the input signal A goes high due to the sequential shifting of the input signal A first to the latch circuit 32, and then to the latch circuit 40. In addition, the delay time $t_d$ includes the switching times of the latch circuits 32 and 40 as well as the switching time of the balanced transfer gate circuit 54.

When the output B goes high at time $t_2$, this high output is the input signal to the shift stage circuit 52b which now operates identically to the previously described operation of the shift stage circuit 52a. Thus, the shift stage circuit 52b drives the output signal C high at a time $t_3$, which occurs the delay time $t_d$ after the output signal B goes high at time $t_2$. Similarly, the shift stage circuit 52c drives the output D high at a time $t_4$, which is the delay time $t_d$ after the output C goes high.

At a time $t_5$, the input signal A goes low. The low input signal A is coupled through the activated transfer gate 28 to the input of the latch circuit 32, which latches its input low and output high. At a time $t_6$, the clock driver circuit 51 drives the clock signal CLK1 high in response to the clock signal CLK going high, activating transfer gates 56 and 58 and deactivating transfer gate 28. When transfer gates 56 and 58 are activated, the high output of the latch circuit 32 is coupled through the balanced transfer gate circuit 54 to the input of the latch circuit 40, which drives its input high and the output B low at a time $t_7$. The shift stage circuits 52b and 52c thereafter drive their respective outputs C and D low at time $t_8$ and $t_9$, respectively.

As seen in FIG. 3, each of the outputs B, C, and D has the same pulse width $t_w$. The constant pulse width $t_w$ is achieved by the constant switching time of the balanced transfer gate circuits 54. If only two transfer gates were connected in series between the output of the latch circuit 32 and the input of the latch circuit 40, as in prior art circuits, the output signals B, C, and D would have different pulse widths depending on the order in which the series connected transfer gates were activated as previously discussed. For example, assume only the transfer gates 56 and 60 are connected between the output of the latch circuit 32 and the input of the latch circuit 40. At the time $t_1$, the transfer gate 60 is activated before the transfer gate 56, and at just after the time $t_2$ the transfer gate 56 is activated before the transfer gate 60. As a result, the delay time between the output B going high and the output C going high may be shorter than the delay time between the input A and the output B going high. This variation in the switching time for the series-connected transfer gates 56 and 60 may result in unequal pulse widths $t_w$ for the outputs B, C, and D.

The balanced transfer gate circuit 54 achieves a relatively constant switching time by always activating one transfer gate coupled directly to its output such that this transfer gate directly drives the load presented on the output. For example, assume the input is high and the transfer gates 60 and 62 are activated. At this point, the input of the transfer gate 58 is high since the transfer gate 62 is activated. When the transfer gates 56 and 58 are thereafter activated, the transfer gate 58 directly drives the load presented on the output. In contrast, the transfer gate 56 must drive the load presented on the output through the transfer gate 60, which presents a channel resistance as previously discussed. Thus, when the load on the output is largely capacitive, the additional channel resistance of the transfer gate 60 increases the time it takes for the transfer gate 56 to drive the capacitive load high. In the balanced transfer gate circuit 54, either the transfer gate 60 or 58 directly drives the load on the output to the desired level.

The shift register circuit 50 of FIG. 2 may be utilized in a variety of logic circuit applications. One such application is in a command signal generator operable to develop a series of command signals for controlling operation of a dynamic random access memory ("DRAM"). The command signal generator typically generates the command signals in response to a clock signal for synchronous devices, such as synchronous memory devices, and generates the command signals in response to a number of control signals in asynchronous memory devices, as known in the art.

Figure 4:
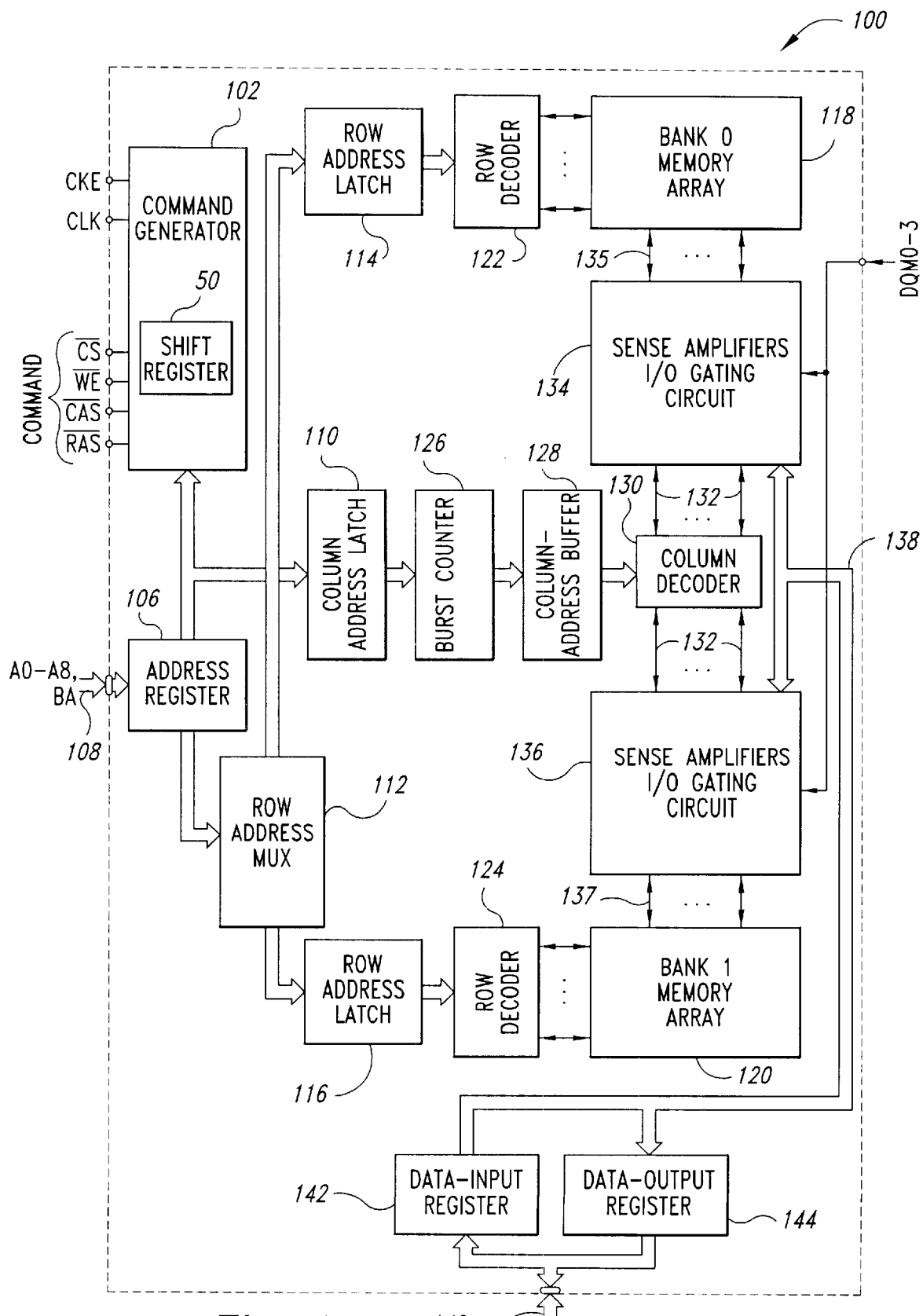
FIG. 4 is a block diagram of a memory device having a command generator including the shift register circuit of FIG. 3.

FIG. 4 is a block diagram of a synchronous DRAM ("SDRAM") 100 containing a command generator 102 including the shift register circuit 50 of FIG. 2. The command generator 102 utilizes the shift register circuit 50 in developing a number of command signals for controlling operation of the SDRAM 100. In the SDRAM 100, all operations are referenced to a particular edge of the external clock signal CLK, typically the rising edge, as known in the art. The command generator 102 receives a number of command signals on respective external terminals of the SDRAM 100. These command signals typically include a chip select signal $\overline{CS}$, write enable signal $\overline{WE}$, column address strobe signal $\overline{CAS}$, and row address strobe signal $\overline{RAS}$. Specific combinations of these signals define particular data transfer commands of the SDRAM 100 such as ACTIVE, PRECHARGE, READ, and WRITE as known in the art. An external circuit, such as a processor or memory controller, generates these data transfer commands in reading data from and writing data to the SDRAM 100.

The SDRAM 100 further includes an address register 106 operable to latch an address applied on an address bus 108 and output the latched address to the command generator 102, a row address multiplexer 112, and a column address latch 110. The row address multiplexer 112 outputs a row address to either a row address latch 114 for a first bank of memory, BANK 0, 118 or a row address latch 116 for a second bank of memory, BANK 1, 120. The row address latches 114 and 116, when activated, latch the row address from the row multiplexer 112 and output this latched row address to an associated row decoder circuit 122 and 124, for BANK 0, 118 or BANK 1, 120, respectively. The row decoder circuits 122 and 124 decode the latched row address and activate a corresponding row of memory cells in the memory banks 118 and 120, respectively. The memory banks 118 and 120 each include a number of memory cells (not shown) arranged in rows and columns, and each memory cell is operable to store a bit of data at an associated row and column address.

The column address latch 110 latches a column address output from the address register 106 and, in turn, outputs the column address to a burst counter circuit 126. The burst counter circuit 126 develops sequential column addresses beginning with the latched column address when the SDRAM 100 is operating in a burst mode. The burst counter 126 outputs the developed column addresses to a column address buffer 128, which in turn outputs the developed column address to a column decoder circuit 130. The column decoder circuit 130 decodes the column address and activates one of a plurality of column select signals 132 corresponding to the decoded column address. The column select signals 132 are output to sense amplifier and I/O gating circuits 134 and 136 associated with the memory banks 118 and 120, respectively. The sense amplifier and I/O gating circuits 134 and 136 sense and store the data placed on the digit lines 135 and 137, respectively, by the memory cells in the addressed row, and thereafter couple the digit lines 135 or 137 corresponding to the addressed memory cell to an internal data bus 138. The internal data bus 138 is coupled to a data bus 140 through either a data input register 142 or a data output register 144. A data mask signal DQM controls the circuits 134 and 136 to avoid data contention on the data bus 140 when, for example, a READ command is followed immediately by a WRITE command, as known in the art.

In operation, during a read data transfer operation, an external circuit, such as a processor, applies a bank address BA and a row address on the address bus 108 and provides an ACTIVE command to the command generator 102. This applied address and command information is latched by the SDRAM 100 on the next rising edge of the external clock signal CLK, and the command generator 102 thereafter activates the addressed memory bank 118 or 120. The supplied row address is coupled through the row address multiplexer 112 to the row address latch 114 or 116 associated with the addressed bank. The corresponding row decoder 122 or 124 thereafter decodes this row address and activates the corresponding row of memory cells in the activated memory, bank 118 or 120. The sense amplifiers in the corresponding sense amplifier and I/O gating circuit 134 or 136 sense and store the data contained in each memory cell in the activated row of the addressed memory bank 118 or 120.

The external circuit thereafter provides a READ command to the command generator 102 and a column address on the address bus 108, both of which are latched on the next rising edge of the external clock signal CLK. The latched column address is then routed through the circuits 110, 126, and 128 to the column decoder circuit 130 under control of the command generator 102. The column decoder 130 decodes the latched column address and activates the column select signal 132 corresponding to that decoded column address. In response to the activated column select signal 132, the sense amplifier and I/O gating circuit 134 or 136 transfers the addressed data onto the internal data bus 138, and the data is then transferred from the internal data bus 138 through the data output register 144 and onto the data bus 140 where it is read by the external circuit.

During a write data transfer operation, after activating the addressed memory bank 118 or 120 and the addressed row within that bank, the external circuit applies a WRITE command to a command decode circuit (not shown) including a column address on the address bus 108, and applies data on the data bus 140. The WRITE command, column address, and data are latched respectively into the command generator 102, address register 106, and data input register 142 on the next rising edge of the external clock signal CLK. The data latched in the data input register 142 is placed on the internal data bus 138, and the latched column address is routed through the circuits 110, 126, and 128 to the column decoder circuit 130 under control of the command generator 102. The column decoder 130 decodes the latched column address and activates the column select signal 132 corresponding to that decoded address. In response to the activated column select signal 132, the data on the internal data bus 138 is transferred through the sense amplifier and I/O gating circuit 134 or 136 to the digit lines 135 or 137 corresponding to the addressed memory cell. The row containing the addressed memory cell is thereafter deactivated to store the written data in the addressed memory cell.

Figure 5:
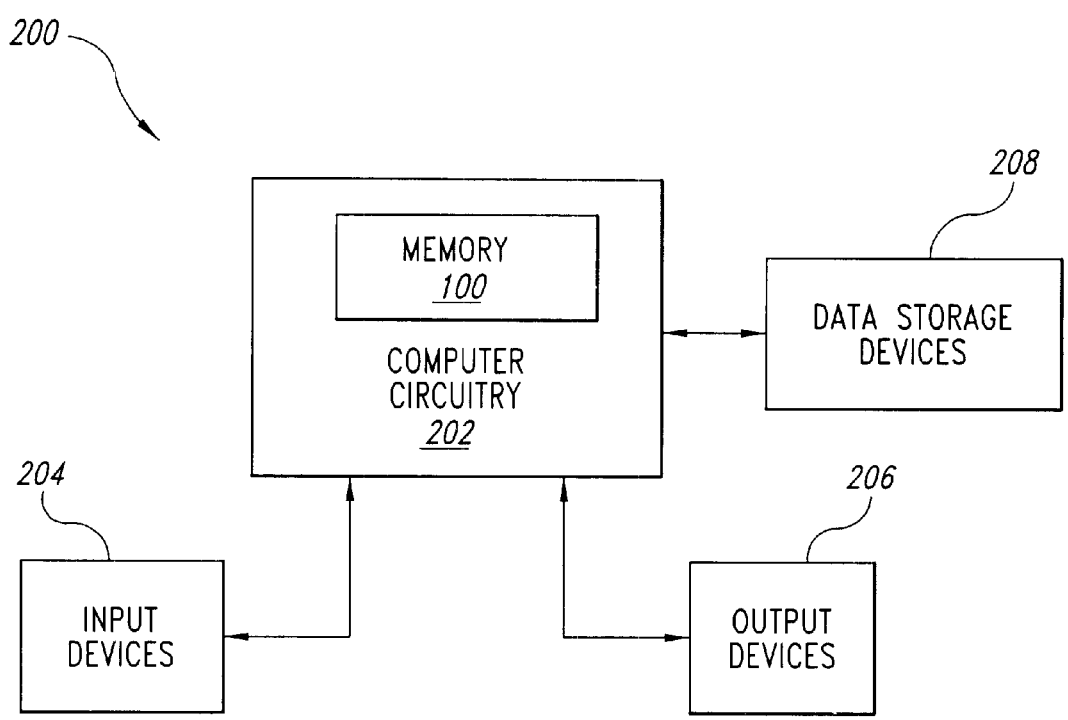
FIG. 5 is a block diagram of a computer system including the memory device of FIG. 4.

FIG. 5 is a block diagram of a computer system 200 including the SDRAM 100 of FIG. 4. The computer system 200 includes computer circuitry 202, such as a processor, for performing various computing functions, such as executing specific software to perform specific calculations or tasks. In addition, the computer system 200 includes one or more input devices 204, such as a keyboard or a mouse, coupled to the computer circuitry 202 to allow an operator to interface with the computer system 200. Typically, the computer system 200 also includes one or more output devices 206 coupled to the computer circuitry 202, such output devices typically being a printer or a video terminal. One or more data storage devices 208 are also typically coupled to the computer circuitry 202 to store data or retrieve data from external storage media (not shown). Examples of typical data storage devices 208 include hard and floppy disks, tape cassettes, and compact disk read-only memories (CD-ROMs). The computer circuitry 202 is typically coupled to the SDRAM 100 through a control bus, a data bus, and an address bus to provide for writing data to and reading data from the SDRAM 100. A clock circuit (not shown) typically develops a clock signal driving the computer circuitry 202 and SDRAM 100 during such data transfers.

Figure 6:
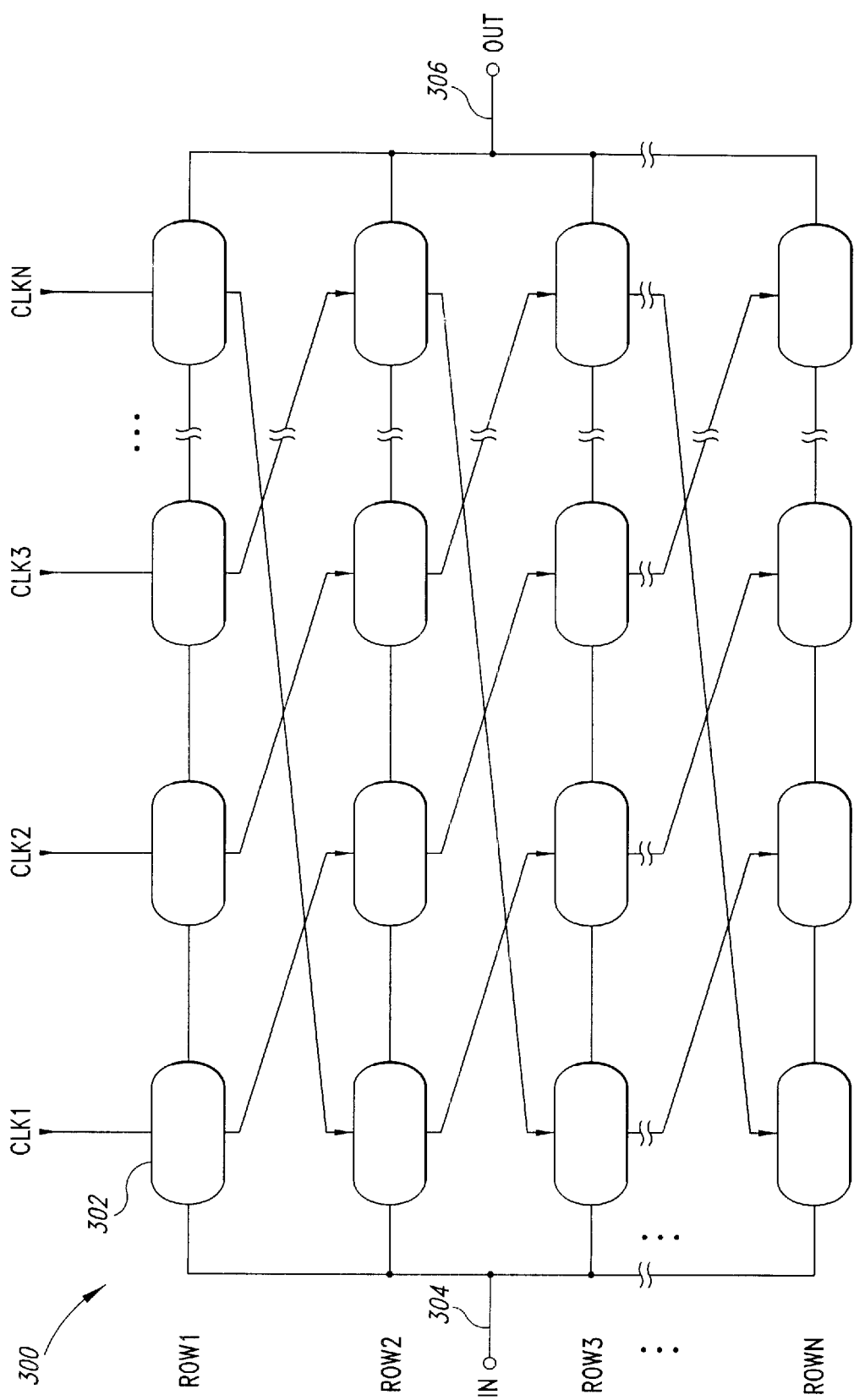
FIG. 6 is a schematic diagram of a balanced switching circuit according to another embodiment of the present invention.

FIG. 6 is a schematic diagram of a balanced switching circuit 300 according to another embodiment of the present invention. The balanced switching circuit 300 includes a number of individual switch circuits 302, each individual switch circuit coupling its input to its output in response to a control or clock signal. The switch circuits 302 are arranged in N rows and N columns with the inputs and outputs of the N switch circuits 302 in each row coupled in series between a first signal terminal 304 and a second signal terminal 306. Each switch circuit 302 receives one of N clock signals CLK1–CLKN, and each clock signal CLK1–CLKN is received by only one switch circuit in each row and one switch circuit in each column. The balanced switching circuit 300 couples the first signal terminal 304 to the second signal terminal 306 in response to the clock signals CLK1–CLKN.

It is to be understood that even though various embodiments and advantages of the present invention have been set forth in the foregoing description, the above disclosure is illustrative only, and change may be made in detail, and yet remain within the broad principles of the invention. Therefore, the present invention is limited only by the appended claims.

What is claimed is:

1. A switching circuit coupling a first terminal to a second terminal, comprising a plurality of parallel switch paths coupled between the first and second terminals, each switch path having a plurality of switches coupled in series and activated in a unique activation sequence according to the logic states of clock signals applied to the switches of the switch paths, only one switch path having an activation sequence where the last switch in the series of switches of that switch path is activated subsequent to the activation of all other switches in the series.

2. The switching circuit of claim 1 wherein each switch of the switch paths is coupled to receive a clock signal and its complement.

3. The switching circuit of claim 1 wherein each switch in the switch paths comprises a transfer gate.

4. The switching circuit of claim 3 wherein each transfer gate comprises an n-channel metal oxide semiconductor (MOS) transistor coupled in parallel to a p-channel MOS transistor.

5. The switching circuit of claim 4 wherein the number of switch paths coupled between the first and second terminals is equal to the number of switches in each switch path.

6. A switching circuit for coupling a first terminal to a second terminal in response to the logic states of n clock signals, the switching circuit comprising an n x n array of switches having the switches of a row coupled in series between the first and second terminals, each switch of a row coupled to receive one of the n clock signals and, when coupling the first terminal to the second terminal, only one row of the array of switches having an activation sequence where the nth switch is activated subsequent to all other switches in the row.

7. The switching circuit of claim 6 wherein n is equal to 2.

8. The switching circuit of claim 6 wherein each switch of the switch paths is coupled to receive a clock signal and its complement.

9. The switching circuit of claim 6 wherein each switch in the switch paths comprises a transfer gate.

10. The switching circuit of claim 9 wherein each transfer gate comprises an n-channel metal oxide semiconductor (MOS) transistor coupled in parallel to a p-channel MOS transistor.

11. A switching circuit for coupling a first terminal to a second terminal, comprising a plurality of rows, each row having a plurality of switches coupled in series between the first and second terminal, each switch in a row coupled to receive a respective clock signal and activate in response thereto, each row of switches having an activation sequence different from any other row and only one row having a sequence wherein the last switch in the row activates last when coupling the first terminal to the second terminal.

12. The switching circuit of claim 11 wherein each switch of a row is coupled to receive the respective clock signal and its complement.

13. The switching circuit of claim 11 wherein each switch of a row comprises a transfer gate.

14. The switching circuit of claim 13 wherein each transfer gate comprises an n-channel metal oxide semiconductor (MOS) transistor coupled in parallel to a p-channel MOS transistor.

15. The switching circuit of claim 11 wherein the number of switches in each row is equal to the number of rows coupled between the first and second terminals.

16. A memory device, comprising:
    an address bus;
    a control bus;
    a data bus;
    an, address decoder coupled to the address bus;
    read/write circuitry coupled to the data bus;
    a memory-cell array coupled to the address decoder and the read/write circuitry; and
    a control circuit coupled to the control bus and operable to control operation of the address decoder, read/write circuitry, and memory-cell array in response to an external clock signal, the control circuit including a shift register circuit comprising a switching circuit for coupling a first terminal to a second terminal including a plurality of rows, each row having a plurality of switches coupled in series between the first and second terminal, each switch in a row coupled to receive a respective clock signal and activate in response thereto, each row of switches having an activation sequence different from any other row and only one row having a sequence wherein the last switch in the row activates last when coupling the first terminal to the second terminal.

17. The memory device of claim 16 wherein each switch of a row of the switching circuit is coupled to receive the respective clock signal and its complement.

18. The memory device of claim 16 wherein each switch of a row of the switching circuit comprises a transfer gate.

19. The memory device of claim 18 wherein each transfer gate comprises an n-channel metal oxide semiconductor (MOS) transistor coupled in parallel to a p-channel MOS transistor.

20. The memory device of claim 16 wherein the number of switches in each row of the switching circuit is equal to the number of rows coupled between the first and second terminals.

21. A method for controlling an array of transfer gates, the array including N rows and N columns, and each row having N transfer gates connected in series between first and second signal terminals, the method comprising:
    providing N clock signals to the array, each clock signal being provided to only one transfer gate in each row and only one transfer gate in each column; and
    activating the N clock signals to couple the first signal terminal to the second signal terminal.

22. The method of claim 21 wherein activating the N clock signals activates the transfer gates of the array, the transfer gates in each row of transfer gates activated according to a sequence to couple the first signal terminal to the second signal terminal such that in one row the Nth transfer gate is activated after the other transfer gates of the row have been activated.

23. A method for controlling an array of transfer gates, the array including N rows and N columns, and each row having N transfer gates connected in series between first and second signal terminals, the method comprising:
    providing N clock signals to the array, each transfer gate receiving one of the clock signals; and
    activating the N clock signals to activate the transfer gates of the array, each row of transfer gates activated according to a sequence to couple the first signal terminal to the second signal terminal such that in one row the Nth transfer gate is activated after the other transfer gates of the row have been activated.

24. The method of claim 23 wherein providing N clock signals to the array comprises providing N clock signals and the complement of the N clock signals to the array.

25. A method for controlling an array of transfer gates to electrically couple first and second signal terminals, the array including N rows and N columns, and each row having N transfer gates series connected between the first and second signal terminals, the method comprising the steps of:
    providing N clock signals to the array, each clock signal being provided to only one transfer gate in each row and only one transfer gate in each column; and
    activating the N clock signals to activate the transfer gates of each row in accordance with a different transfer gate activation sequence to couple the first signal terminal to the second signal terminal.

26. The method of claim 25, further comprising latching a signal at the second signal terminal in response to the first signal terminal coupling to the second signal terminal.

27. A method for controlling an array of transfer gates to electrically couple first and second signal terminals, the array including N rows and N columns, and each row having N transfer gates connected in series between the first and second signal terminals, the method comprising the steps of:
    providing N clock signals to the array, each transfer gate receiving one of the clock signals; and
    activating the N clock signals to couple the first signal terminal to the second signal terminal, the sequence of transfer gate activation for each row being different.

28. The method of claim 27 wherein transitions of the N clock signals are simultaneous.

* * * * *

UNITED STATES PATENT AND TRADEMARK OFFICE
CERTIFICATE OF CORRECTION

PATENT NO. : 6,516,382 B2
DATED : February 4, 2003
INVENTOR(S) : Troy A. Manning It is certified that error appears in the above-identified patent and that said Letters Patent is hereby corrected as shown below:

<u>Title page, Item [54] and Column 1, lines 1-4,</u>
"MEMORY DEVICE BALANCED SWITCHING" should read
-- MEMORY DEVICE, BALANCED SWITCHING --

<u>Column 2,</u>
Line 8, "The :external circuitry" should read -- The external circuitry --
Line 66, "is a dining diagram" should read -- is a timing diagram --

<u>Column 4,</u>
Line 11, "just before a time to, the" should read -- just before a time $t_0$, the" --

<u>Column 6,</u>
Line 59, "activated memory, bank" should read -- activated memory bank --

<u>Column 8,</u>
Line 33, "of claim 4 wherein" should read -- of claim 1 wherein --

Signed and Sealed this

Sixth Day of January, 2004

JAMES E. ROGAN
*Director of the United States Patent and Trademark Office*